United States Patent
Benaissa

(10) Patent No.: US 10,886,158 B2
(45) Date of Patent: Jan. 5, 2021

(54) METHOD FOR TRANSFERRING STRUCTURES

(71) Applicant: Commissariat A L'Energie Atomique et aux Energies Alternatives, Paris (FR)

(72) Inventor: Lamine Benaissa, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/505,862

(22) Filed: Jul. 9, 2019

(65) Prior Publication Data
US 2020/0020561 A1    Jan. 16, 2020

(30) Foreign Application Priority Data
Jul. 13, 2018   (FR) ..................................... 18 56513

(51) Int. Cl.
| H01L 21/683 | (2006.01) |
| H01L 25/075 | (2006.01) |
| H01L 33/62  | (2010.01) |

(52) U.S. Cl.
CPC ...... *H01L 21/6835* (2013.01); *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
None
See application file for complete search history.

(56) References Cited

U.S. PATENT DOCUMENTS

| 6,204,079 B1 | 3/2001 | Aspar et al. |
| 10,357,917 B2 | 7/2019 | Benaissa et al. |
| 2006/0231288 A1* | 10/2006 | Vanfleteren ............. H01L 25/50 174/254 |
| 2016/0043254 A1 | 2/2016 | Krause et al. |

(Continued)

FOREIGN PATENT DOCUMENTS

EP     0 977 252 A1    2/2000

OTHER PUBLICATIONS

U.S. Appl. No. 14/893,396, filed Nov. 23, 2015, 2016/0126215, Imbert, B., et al.

(Continued)

*Primary Examiner* — J. E. Schoenholtz
(74) *Attorney, Agent, or Firm* — Oblon, McClelland, Maier & Neustadt, L.L.P.

(57) ABSTRACT

The invention relates to a method for transferring structures on a host substrate, the method comprising the following steps in sequence:
  a) supply a temporary substrate comprising two main faces, the temporary substrate being stretchable, the structures being assembled with their front face on the first face;
  b) stretch the temporary substrate along at least one direction so as to increase the space between the structures along at least one direction,
  c) a step for transferring the plurality of structures on a host face of a host substrate,
The temporary substrate comprises a matrix made of a stretchable material, and a plurality of inserts on which the structures are assembled, the inserts comprising a material with a Young's Modulus higher than that of the stretchable material.

20 Claims, 7 Drawing Sheets

(56) References Cited

U.S. PATENT DOCUMENTS

2016/0111604 A1\* 4/2016 Li ............................ H01L 24/95
                                                            257/91
2017/0061867 A1\* 3/2017 Cok ......................... G09G 3/32

OTHER PUBLICATIONS

U.S. Appl. No. 16/003,199, filed Jun. 8, 2018, 2018/0358381, Lamy, Y., et al.
U.S. Appl. No. 16/221,939, filed Dec. 17, 2018, 2019/0198397, Andrieu, F., et al.
French Preliminary Search Report dated May 23, 2019 in French Application 18 56513, filed on Jul. 13, 2018 (with English Translation of Categories of Cited Documents).
Na, J, et al., "Programming Reversibly Self-folding Origami with Micropatterned Photo-Crosslinkable Polymer Trilayers", Advanced Materials, 27, pp. 79-85, 2015.
Tachi, T, "Freeform Origami Tessellations by Generalizing Resch's Patterns", Proceedings of the ASME 2013 International Design Engineering Technical Conference and Computers and Information in Engineering Conference IDETC/CIE 2013, 10 pages.
Ionov, L, "Soft microorigami: self-folding polymer films", Soft Matter, 2011, 7, pp. 6786-6791.

\* cited by examiner

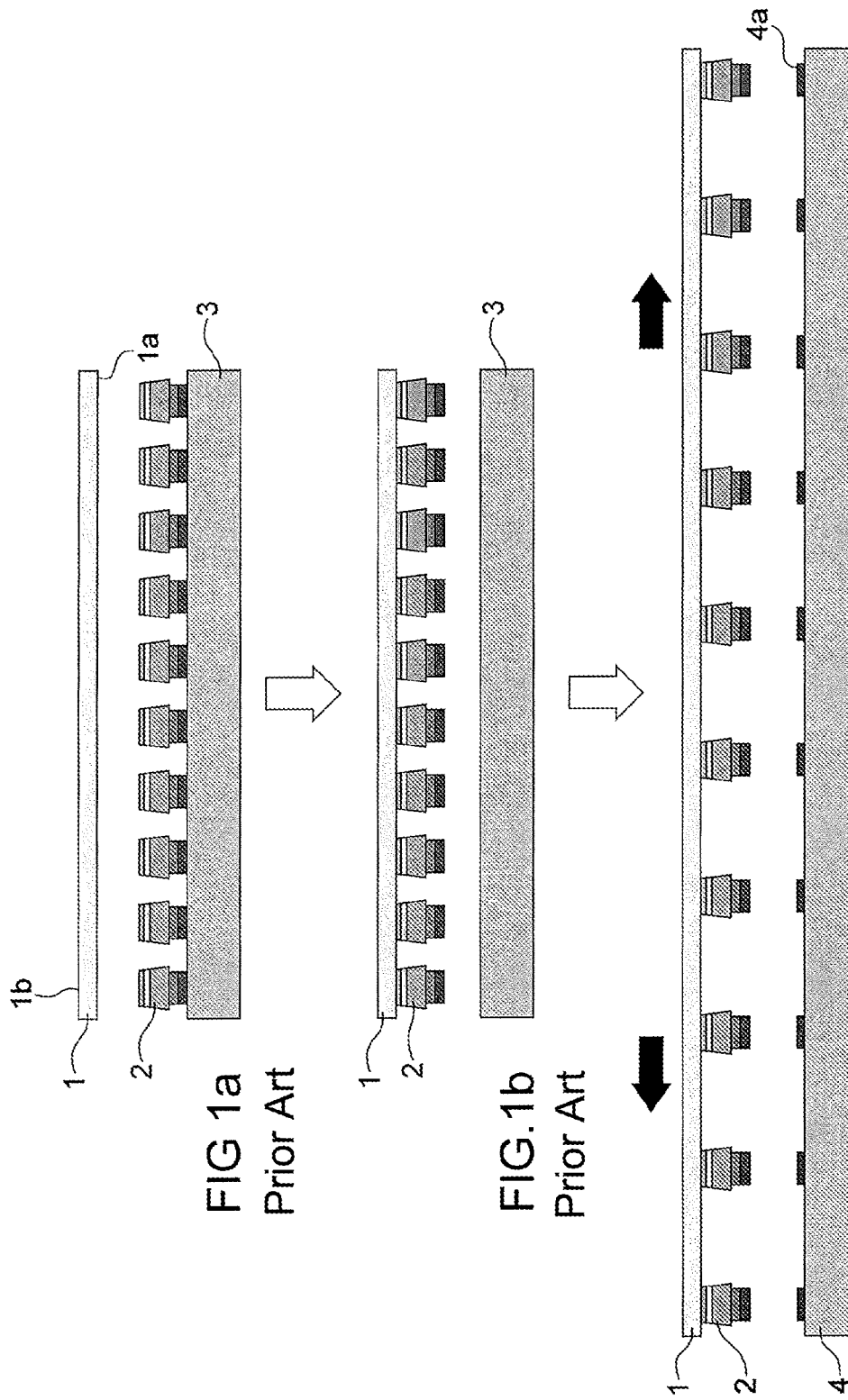

METHOD FOR TRANSFERRING STRUCTURES

TECHNICAL FIELD

This invention relates to a method for transferring structures onto a host face of a host substrate. In particular, this invention makes use of a stretchable temporary substrate provided with inserts designed to minimise or even prevent the development of stresses in structures when the temporary substrate is stretched.

STATE OF PRIOR ART

A method for transferring structures known in the state of the art is described in document [1] cited at the end of the description and illustrated in FIGS. 1a to 1c.

The method known in the state of the art comprises the following steps in particular:

a) supply a temporary substrate comprising two main faces, essentially parallel, called the first face and the second face respectively, the temporary substrate being stretchable, a plurality of structures being assembled with one of the faces called the front face on the first face;

b) stretch the temporary substrate along at least one direction so as to increase the space between the structures along at least one direction, c) a step for transferring the plurality of structures onto a host face of a final substrate.

Step a) is generally preceded by a step for taking off the plurality of structures resting on one of the faces, opposite the front face and called the back face, on a face called the initial face of an initial structure.

In particular, the taking off step (FIG. 1a) may comprise the assembling of the first face of the temporary substrate with the front face of each of the structures, following by detachment of said structures from the initial face (FIG. 1b).

In this respect, adhesion between the back face and the initial face is generally adjusted to facilitate the taking off step.

In particular, adhesion energy between the back face and the initial face may be lower than the adhesion energy of the structures on the first face of the temporary substrate, such that detachment between the initial face of the initial substrate and the back face of the structures takes place selectively.

The temporary substrate disclosed in [1] is a stretchable substrate. In other words, the temporary substrate is made of a material with a sufficiently low Young's modulus so that said temporary substrate can be stretched along at least one direction, called the stretching direction. In particular, the material according to [1] may comprise a flexible polymer material, and particularly an elastomer.

"Elastomer" means a polymer that has elastic properties and that, under the effect of tension or stretching, can have a large deformation before breaking. More particularly, the measurement of the elasticity of a material is quantified by its Young's modulus, and a material will be considered to be stretchable if its Young's Modulus is less than 0.1 GPa.

Step b) in the method known in the state of the art comprises the application of a tension force to the temporary substrate along at least one direction, contained in the plane formed by the first face, so as to stretch said substrate (FIG. 1c). This stretching results in an increased space between the structures before they are transferred onto the host face of the host substrate.

This method is then used when structures are to be transferred according to an arrangement or with different spacing between said structures from one substrate to another, thus compensating for cost and time cycle problems associated with the transfer of structures by individual placement (Pick and Place).

However, this method of massive transfer of structures is also not satisfactory.

Stretching of the temporary substrate in step b) is not uniform. In particular, the stretching amplitude of the contact zones between the structures and the temporary face is not the same as it is on the remaining part of the temporary substrate.

This non-uniform stretching affects, and in particular reduces, adhesion of structures on the temporary face. It also compromises alignment in the plane of the structures. Therefore the stretching amplitude is limited so as to guarantee adhesion of structures on the temporary surface, and their planeness.

Furthermore, stretching also imposes a stress in the structures, and can therefore cause a deformation of these structures.

Furthermore, the efficiency of taking off structures on the initial substrate is partly governed by the adhesion energy of structures forming the temporary substrate; and selectivity of taking off cannot be guaranteed for all stretchable materials.

Finally, the elasticity of the temporary substrate is such that pressure cannot be applied between the temporary substrate and the host substrate so as to reinforce the adhesion energy between the structures and the host face in step c) of the transfer.

Therefore one purpose of this invention is to disclose a method of making a collective transfer of structures using a stretchable temporary substrate making possible much greater stretching than methods according to prior art.

Another purpose of this invention is to disclose a method of making a collective transfer of structures using a stretchable temporary substrate allowing efficient (in other words selective) taking off on the initial substrate.

Another purpose of this invention is to disclose a method of making a collective transfer of structures using a stretchable temporary substrate than can resist the application of pressure so as to reinforce the adhesion energy between structures and the host substrate during a transfer step.

PRESENTATION OF THE INVENTION

The purposes of this invention are at least partly achieved by a method for transferring structures on a host structure, the method comprising the following steps in sequence:

a) a step for supplying a temporary substrate comprising two main faces, called the first face and the second face respectively, the temporary substrate being stretchable, a plurality of structures each comprising a front face and a back face, being assembled by their front face on the first face;

b) a step for stretching the temporary substrate along at least one direction so as to increase the space between the structures along at least one direction, c) a step for transferring the plurality of structures on a host face of a host substrate, The method being remarkable in that the temporary substrate comprises a matrix made of a stretchable material, and a plurality of inserts on which the structures are assembled, the inserts comprising a material with a Young's Modulus higher than that of the stretchable material.

According to one embodiment, step a) is preceded by a step a1) for taking off structures located on their back face, on a face of an initial substrate called the initial face.

According to one embodiment, the arrangement of inserts of the temporary substrate corresponds to the arrangement of structures on the initial face during the taking off step a1).

According to one embodiment, the taking off step, a1) comprises the following in sequence:
- an assembly of the front face of structures with inserts,
- a detachment, called the first detachment, of structures from the initial substrate.

According to one embodiment, the first detachment requires energy, called the first detachment energy, adjusted to be less than the adhesion energy between the front face of structures and inserts.

According to one embodiment, the first detachment energy is less than 0.3 J/m$^2$.

According to one embodiment, the adjustment of the first detachment energy comprises a step to weaken the interface between the initial face and the back face, advantageously the weakening step includes a reduction of the contact surface area between the initial face and the back face.

According to one embodiment, step b) includes a first stretching along a first direction and a second stretching along a second direction, different from the first direction, that will increase the spacing between structures along the first and second directions.

According to one embodiment, step c) comprises the following in sequence:
- an assembly of structures with the host substrate by bringing said structures into contact through their back face with the host face of the host substrate,
- a detachment, called the second detachment, of structures from inserts so as to transfer said structures on the host face.

According to one embodiment, the second detachment of structures from inserts is preceded by a step to reinforce the assembly of structures with the host substrate.

According to one embodiment, the adhesion energy of structures on inserts is less than the adhesion energy of structures on the host face.

According to one embodiment, the stretchable material comprises an elastomer, and in particular the elastomer comprises at least one material chosen from among butyl rubber, natural rubber, styrene butadiene rubber, silicone elastomers, ethylene vinyl acetate, isoprene, polchloroprene, polychloroprene, polyurethane.

According to one embodiment, the inserts emerge at the two main faces of the temporary substrate.

According to one embodiment, the inserts comprise a material transparent in the UV wavelengths range, advantageously the transparent material comprises glass.

According to one embodiment, the inserts comprise a semiconducting material, advantageously the semiconducting material comprises at least one material chosen from among silicon, germanium, etc.

According to one embodiment, the host substrate comprises sites called host sites on its host face, on which structures are transferred, the host sites being adapted to be conducive to adhesion of structures on said host sites rather than adhesion of said structures on the first face.

The host sites can comprise at least some elements chosen from among solder balls, micro tubes, metallic stacks providing adhesion of structures on the host face by eutectic or thermocompression bonding, magnetic materials, a polymer glue.

The invention also relates to a method for transferring structures of a first type, a second type and a third type on a host substrate, the method comprising in sequence, the transfer according to this invention of structures of the first type, the second type and the third type onto the host substrate.

According to one embodiment, the structures of the first type, the second type and the third type each emit in a different wavelength range.

BRIEF DESCRIPTION OF THE DRAWINGS

Other characteristics and advantages will become clear in the following description of a transfer method according to the invention, given as non-limitative examples, with reference to the appended drawings in which:

FIGS. 1a to 1c are diagrammatic representations of a transfer method involving a stretchable substrate known in the state of the art;

DETAILED PRESENTATION OF PARTICULAR EMBODIMENTS

This invention relates to a method for transferring structures onto a face, called the host face, of a host substrate.

In particular, the transfer step uses a stretchable temporary substrate, and a face on which the structures are arranged. In this respect, the temporary substrate will be stretched along at least one direction before the structures are transferred onto the host face, so as to increase the space between said structures.

According to the terms of this invention, the temporary substrate also comprises a matrix made of a stretchable material, and inserts made of a material with a Young's Modulus higher than that of the stretchable material, and on which the structures are placed.

FIGS. 2a to 2e diagrammatically illustrate the different steps in the method for transferring structures according to this invention.

Figure 2A:
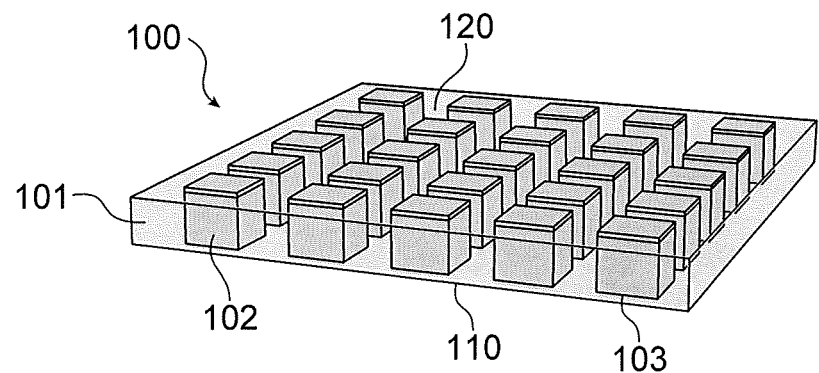
FIGS. 2a to 2e are diagrammatic representations of different steps in the method for transferring structures onto a host substrate according to this invention.
Figure 2B:
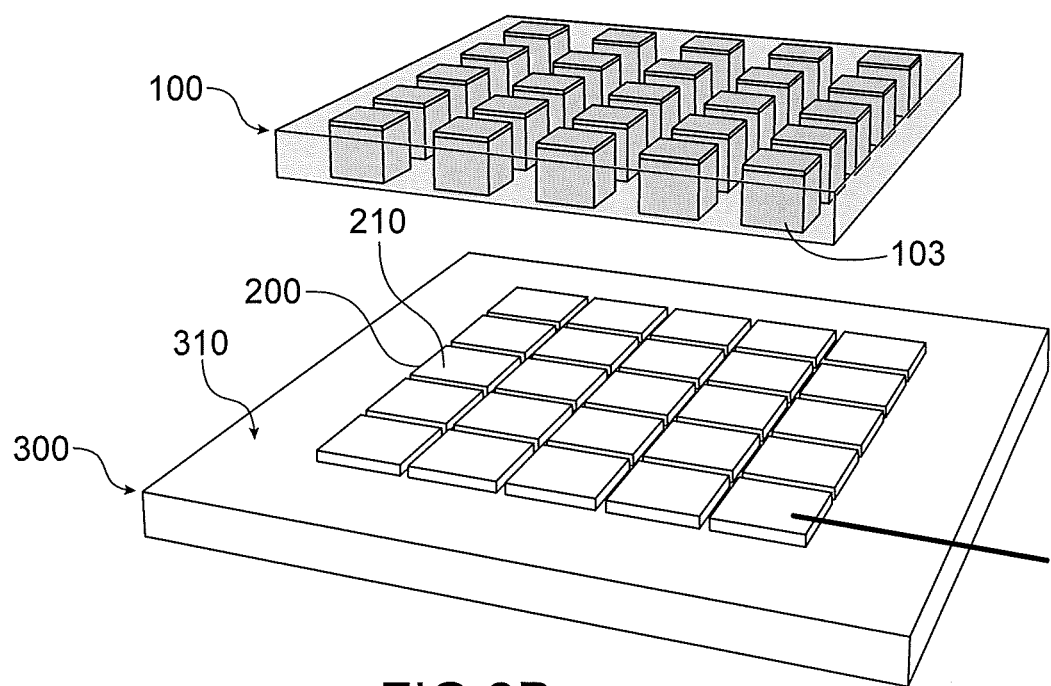

In particular, the method according to this invention includes a step a) for supplying a temporary substrate 100 that includes two essentially parallel main faces, called the first face 110 and the second face 120 respectively (FIG. 2a).

The temporary substrate 100 is stretchable.

"Stretchable" means a temporary substrate 100 that can be considerably stretched or extended before breaking. Stretching of the temporary substrate then corresponds to an elongation of said substrate along a given direction in response to a tension force along said given direction.

The given direction may for example be a direction contained in a plane defined by one or another of the main faces of the temporary substrate 100.

According to this invention, a temporary substrate is stretchable if it can be elongated by at least 20% without breaking along a direction contained in a plane defined by one of its main faces.

The elongation is advantageously an elastic deformation such that said substrate returns to its initial shape as soon as the tension force is removed.

Figure 2C:
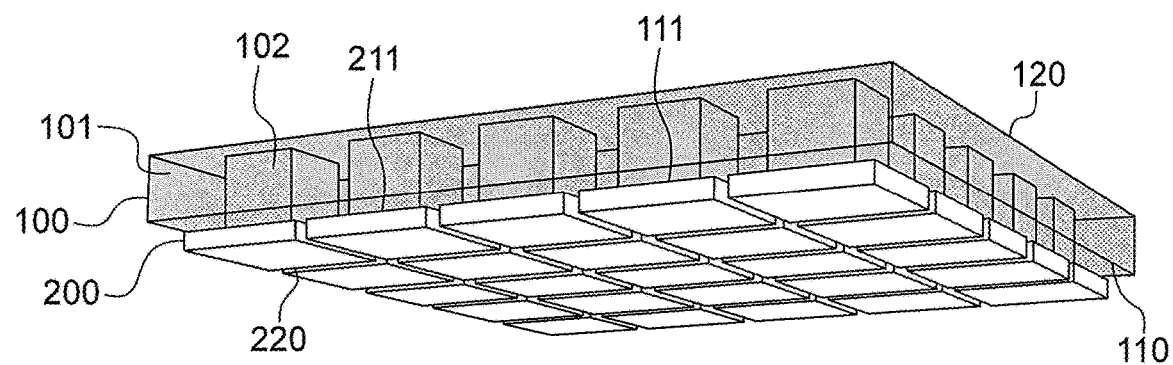

The front faces 210 of a plurality of structures 200, each comprising a front face 210 and a back face 220, are assembled on the front face 110 of the temporary substrate 100 (FIG. 2c).

"Assembled" means that the structures are held to the temporary substrate by adhesion of their front face on the first face of said substrate.

In particular, contact between the front face 210 and the first face 110 forms an interface called the temporary contact interface 111.

The temporary substrate 100 also comprises a matrix 101 composed of a stretchable material and a plurality of inserts 102 on which the structures 200 are assembled (FIGS. 2a and 2c).

"Insert" means a 3d element contained within the temporary substrate, that can emerge on the first face 210 and/or the second face 220 of the temporary substrate.

It is understood that each structure 200 assembled on the first face 110 is in contact with an insert 102. In other words, each insert emerges at least from the front face 110 on a face called the first emerging face 103 (FIG. 2a).

Furthermore, contact between the front face 210 and the first face 110 can be made exclusively at an insert 102. In other words, the temporary contact interface 111 is circumscribed by the contour of the first emerging face 103.

The inserts 102 are advantageously made of a material with a Young's Modulus higher than the Young's Modulus of the stretchable material. In other words, the inserts 102 are "less stretchable" than the matrix.

In a particularly advantageous manner, the stretchable material may include an elastomer material, for example silicone rubber.

The Young's Modulus of the material forming the inserts 102 is advantageously more than 40 GPa.

The material forming the inserts may comprise at least one material chosen from among:
- a metal, for example copper or aluminium,
- a metal alloy
- a glass, a ceramic,
- a semiconductor, for example silicon, germanium, an alloy of silicon and germanium.

The back face 220 of structures 200 assembled on the first face 110 may have been taken off an initial face 310 of an initial substrate 300 (FIG. 2b), during a step a1) preceding step a).

Figure 3:
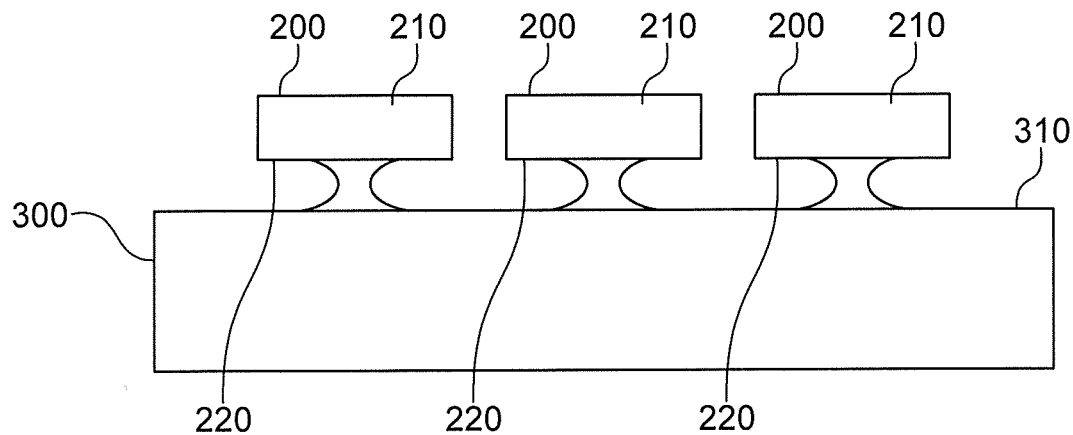
FIG. 3 is a diagrammatic representation of a step to weaken the interface between the structures and the initial face, used for the first detachment.
Figure 4A:
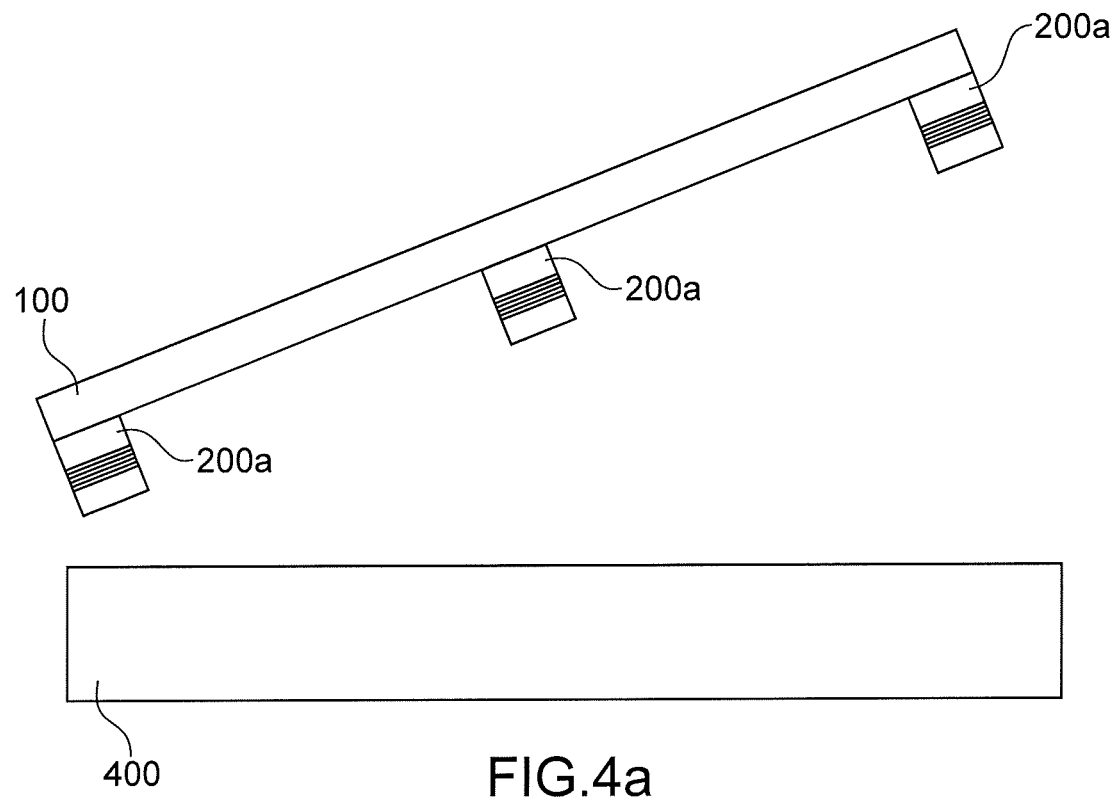
FIGS. 4a to 4f are diagrammatic representations of different steps in the transfer of different types of LEDs, particularly for the formation of displays.
Figure 4B:
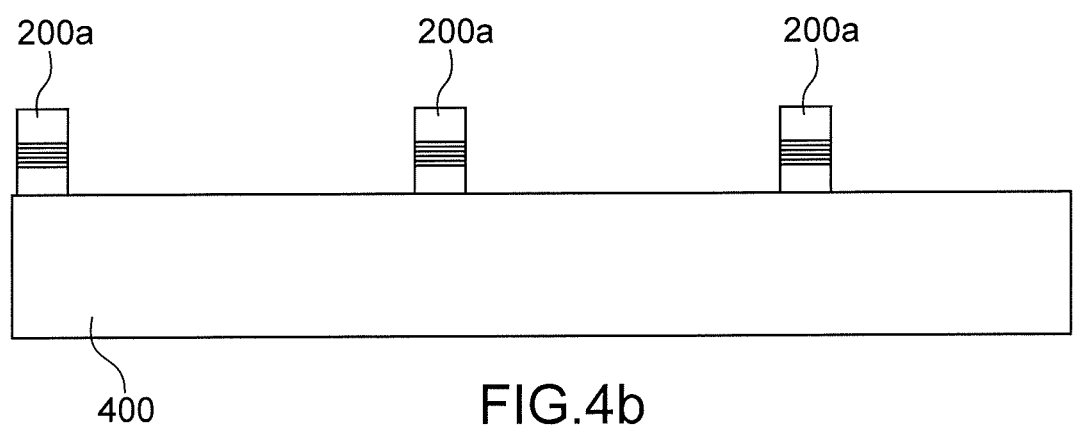
Figure 4C:
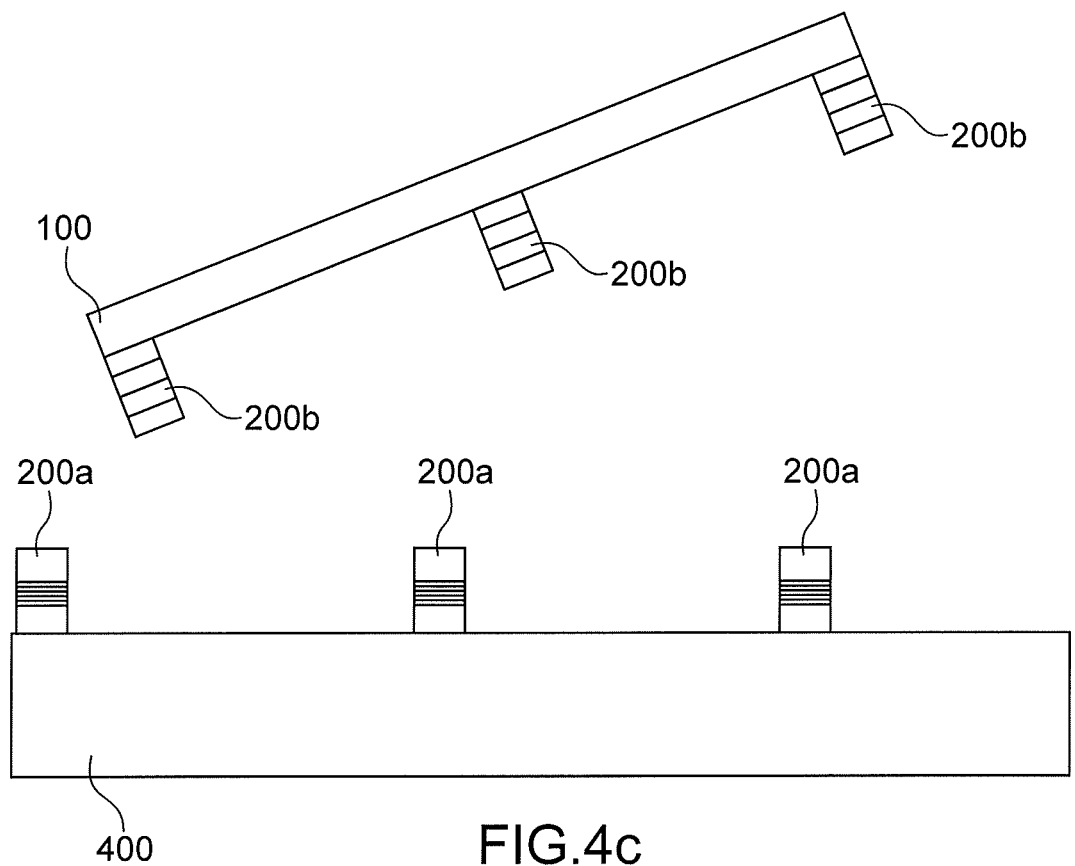
Figure 4D:
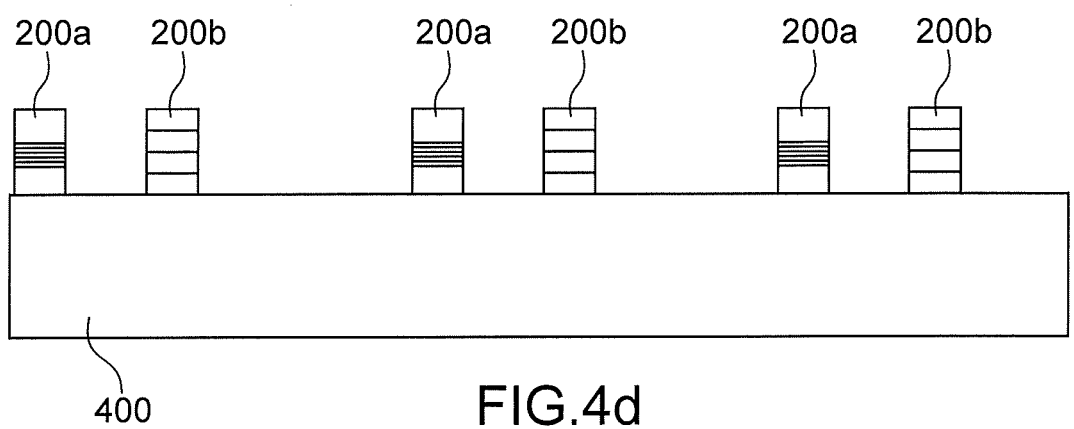
Figure 4E:
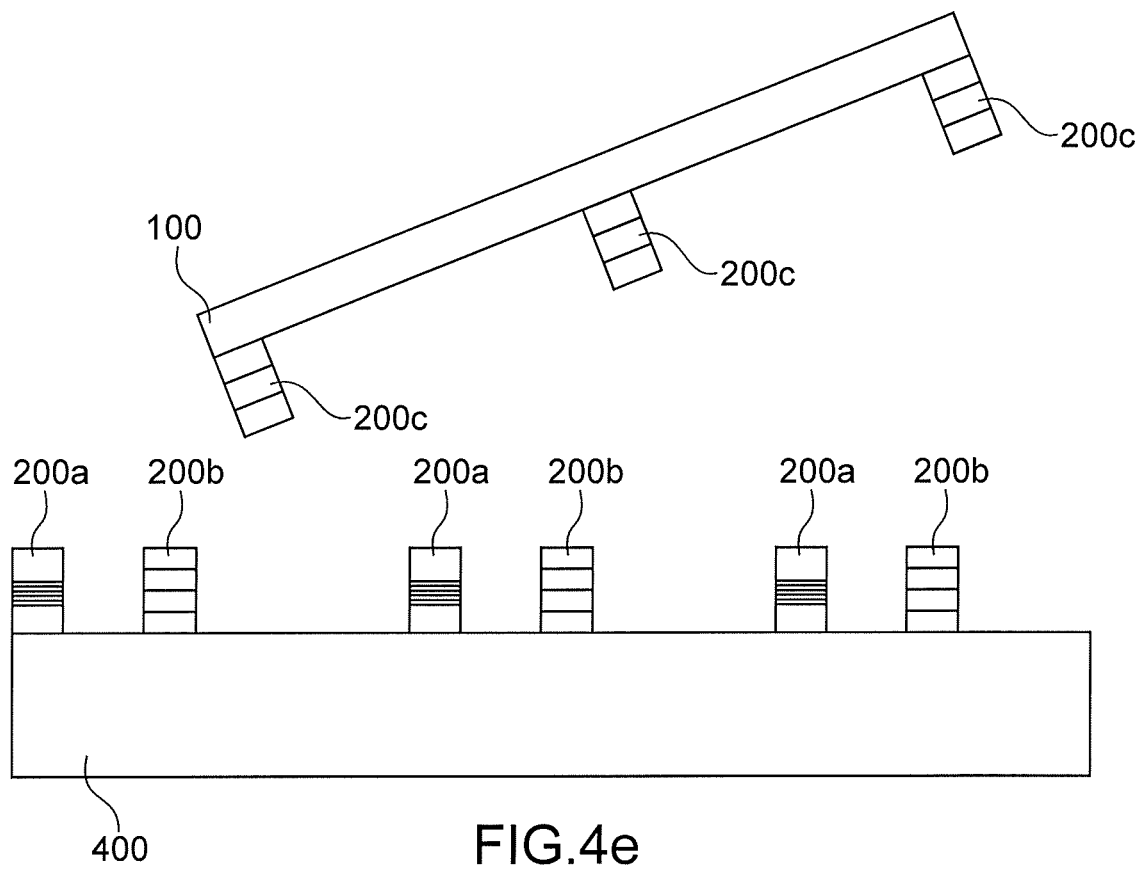
Figure 4F:
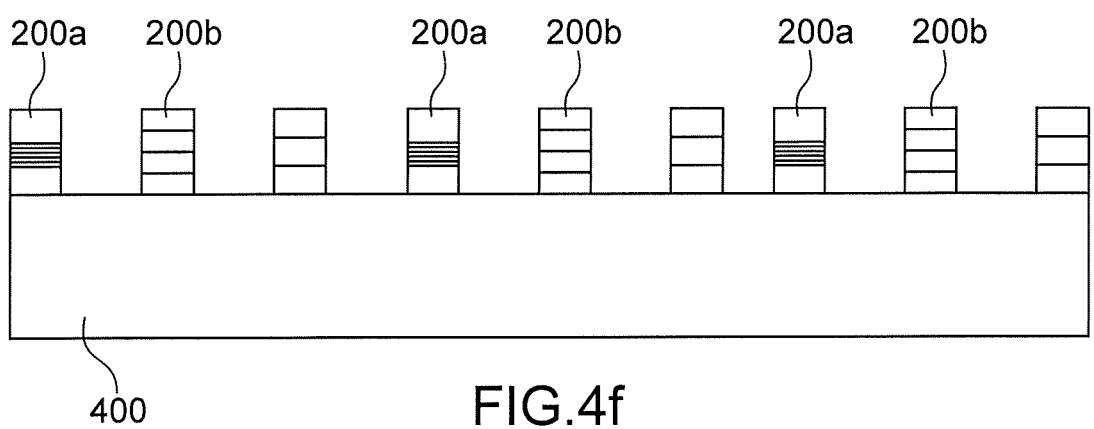

In particular, the taking off step a1) may include the following, in sequence:

1a1) an assembly of the front face 210 of each of the structures 200 with an insert 102, more particularly with the first emerging face 103 of an insert 102, 2a1) a detachment, called the first detachment, of structures from the initial substrate 300 (FIG. 3).

Step 1a1) may include a direct bonding step by bringing the emerging first faces 103 into contact with the front faces 210.

Advantageously, the arrangement of inserts 102 on the temporary substrate 100 corresponds to the arrangement of structures 200 on the initial face 310. In other words, during execution of step 1a1), each insert 102 is brought into contact with a structure 200.

In this respect, the structures can be arranged in matrix form on the initial face, however without limiting this invention to this arrangement.

"Arranged in matrix form" means a regular and periodic arrangement of structures along X and Y directions different from each other and contained in a plane defined by the face on which said structures are resting.

It is understood that the taking off step a1) does not modify this matrix arrangement of the structures.

Furthermore, structures 200 arranged in matrix form impose an arrangement identical to the inserts 102.

The first detachment step 2a1) may require energy, called first detachment energy, adjusted to be less than the adhesion energy between the front face 210 of the structures 200 and the emerging first face 103, called temporary adhesion energy. Thus, this hierarchisation of adhesion energies makes it possible to efficiently take off all the structures 200.

For example, the first adhesion may be adjusted by an appropriate choice of the material forming the initial face.

Alternatively or additionally, the first adhesion energy can also be adjusted by weakening the interface between the initial face 310 of the initial substrate 300 and the back face 220 of the structures 200.

This weakening step may for example include a reduction of the contact surface area between the back face 220 of the structures 200 and the initial face 310 of the initial substrate 300.

The reduction in surface area can be obtained by an etching step, particularly by liquid etching, at the interface formed by the back face 220 and the initial face 310. In particular, the etching step may include partial removal of the material forming the initial face 310 in contact with the back face 220.

The first detachment energy can then be adjusted such that the detachment energy is less than 0.3 $J/m^2$.

Additionally, the temporary adhesion energy is advantageously more than 0.5 $J/m^2$.

Step a) can then be followed by a step b) that consists of stretching the temporary substrate 100 along at least one direction so as to increase the space between the structures 200 along at least one direction.

It is understood, without it being necessary to state it, that the space between the structures 200 is measured along a direction contained in a plane defined by the first face 110.

Figure 2D:
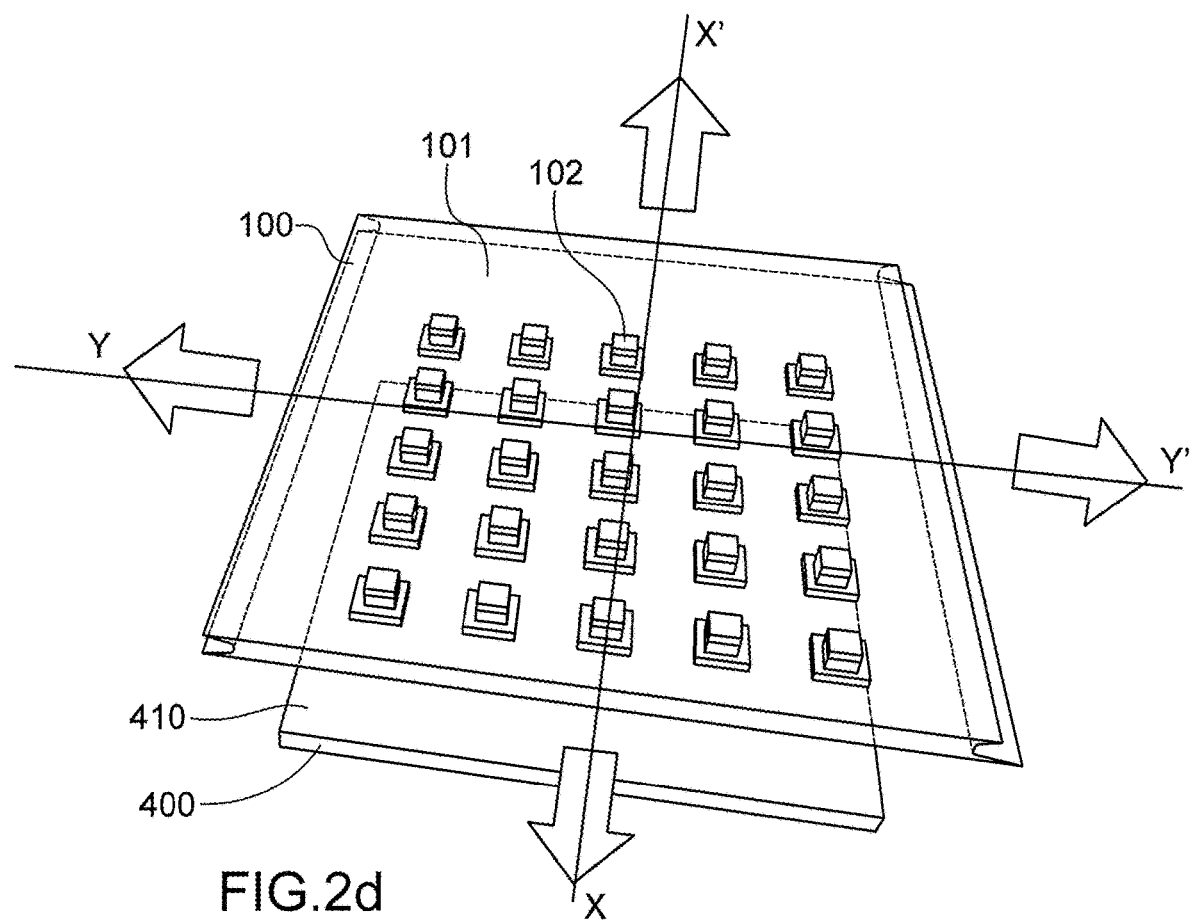

Step b) stretching the temporary substrate 100 may be made by applying a tension force on said substrate along at least one direction so as to apply tension to said substrate (FIG. 2d).

This tensioning causes an increase in the space between structures.

When the structures 200 are supported on inserts 102 than are "less stretchable" than the matrix, they are less affected by elongation of the temporary substrate.

In particular, the structures 200 are less deformed than the temporary substrate 100 such that their adhesion to said substrate is preserved during stretching.

Consequently, a larger stretching range than is possible with a temporary substrate without inserts can be envisaged.

The stretching step b) may include a first stretching made along a first direction and a second stretching made along a second direction YY', different from the first direction, so as to increase the space between structures along the first and second directions. The first stretching and the second stretching can have different amplitudes.

Figure 2E:
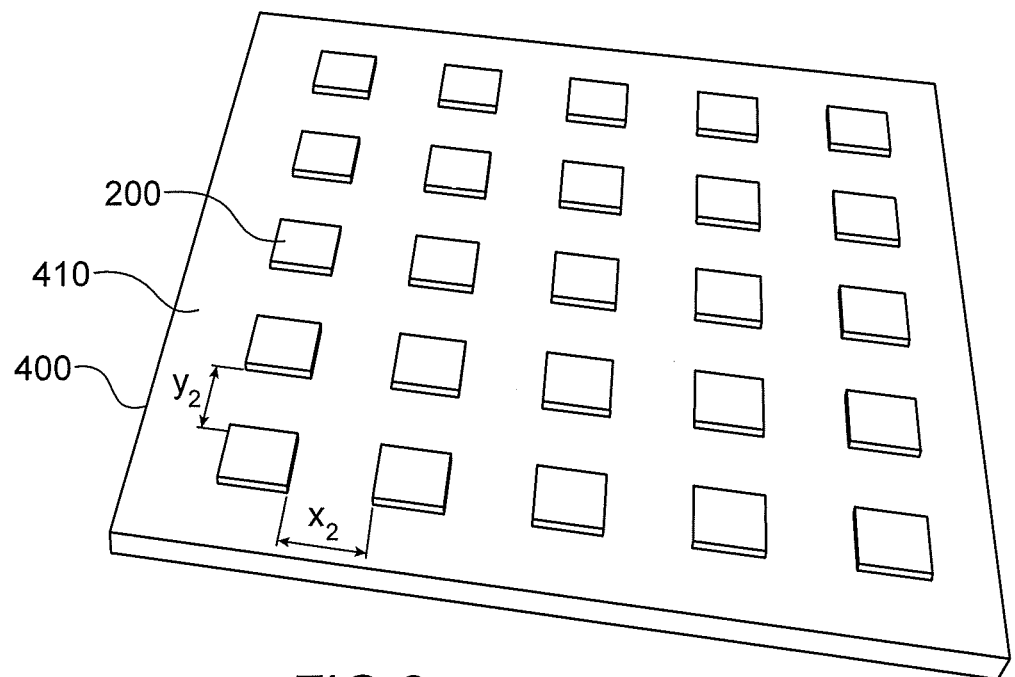

Step b) is followed by a step c) to transfer the plurality of structures on a host face 410 of a host substrate 400 (FIGS. 2d and 2e).

The transfer step d) can include the following steps:

1c) an assembly of structures 200 with the host substrate 400 by bringing said structures 200 into contact through their back face 220 with the host face 410 of the host substrate 400, 2c) a detachment, called the second detachment, of structures 200 from inserts 102 so as to transfer said structures 200 on the host face 410.

The assembly step 1c) advantageously comprises bonding by molecular adhesion (or direct bonding).

Furthermore, the adhesion energy between the structures 200 and the host face 410, called host adhesion energy, is advantageously more than the temporary adhesion energy. For example, the host adhesion energy may be more than 1 J/m².

Step 1c) may be accompanied by reinforcement of the host adhesion energy, for example by pressing the temporary substrate 100 and the host substrate 400 into contact with each other. In this respect, the inserts 102 also advantageously emerge from the second face 120. Said inserts 102 are sufficiently stiff to transmit the to transmit a pressure force to the interface formed by the back face 220 of the structures 200 and the host face 410 of the host substrate 400, and thus reinforce the host adhesion energy.

Step 2c) can be done by weakening the temporary contact interface 111.

This weakening can include a force to separate the temporary substrate 100 from the structures 200. For example, the force can be applied by inserting a blade at the temporary contact interface 111.

Weakening can also be achieved by adding light energy at the temporary contact interface 111 that will cause separation of the structures 200 from the temporary substrate 100.

In particular, the addition of light energy can include the use of incident laser radiation at the temporary contact interface 111, for example a UV laser. In this respect, the inserts 102 are advantageously made from a material transparent to laser radiation used during the detachment. For example, the inserts 102 are made of a material transparent to UV radiation, for example glass.

"UV radiation" means radiation in the range of wavelengths between 315 and 400 μm.

Advantageously, the host substrate 400 comprises sites called host sites on its host face 410, on which structures 200 are transferred, the host sites being adapted to be conducive to adhesion of structures on said host sites rather than adhesion of said structures on the first face.

According to this advantageous characteristic, all the structures remain on host sites during detachment of the temporary substrate 100.

The host sites can comprise at least some elements chosen from among solder balls, micro tubes, metallic stacks providing adhesion of structures on the host face by eutectic or thermocompression bonding, magnetic materials, a polymer glue.

The structures 200 according to this invention may include any type of cell or stack of films. In particular, the structures 200 may comprise at least one structure type chosen from among lenses, reflectors, stack of layers, pads, CMOS components, LEDs, LED and CMOS modules as described in the patent application [2] cited at the end of the description, conversion layers.

This invention can advantageously be used to transfer different types of structures on the same host substrate.

For example, the invention can be used to transfer structures 200 of a first type called first structures 200a, then structures of a second type called second structures 200b, on a single host substrate 400 (FIGS. 4a to 4f).

The first structures 200a and the second structures 200b are then transferred onto the host face of the host substrate according to a first arrangement and a second arrangement respectively.

The first and the second arrangements may be identical and offset in a direction contained in a plane formed by the host face.

Structures 200 of a third type called third structures 200c, can also be transferred according to a third arrangement identical to the first arrangement and offset from the first and second arrangements along a direction contained in a plane formed by the host face.

In one particularly advantageous embodiment, the invention can be used for the formation of displays. In particular, the first, second and third structures comprise blue LEDs, green LEDs and red LEDs respectively (in which LED stands for light emitting diode).

A blue LED is a LED that emits light radiation in the 300 nm-500 nm range of wavelengths.

A red LED is a LED that emits light radiation in the 600 nm-700 nm range of wavelengths.

A green LED is a LED that emits light radiation in the 500 nm-600 nm range of wavelengths.

Formation of the temporary substrate may include the following successive steps:
- supply a substrate made of material that will form inserts;
- formation of inserts by a step consisting of partial etching of the substrate through a mask defining said inserts, said inserts being supported on a portion of the substrate remaining after the etching step;
- formation of a layer of stretchable material that will form the matrix, filling in at least the space between inserts;
- remove the remaining portion of the substrate so as to release a temporary substrate formed by the matrix and the inserts.

REFERENCE

[1] US 2016/111604
[2] FR 1561421

The invention claimed is:

1. A method for transferring structures on a host substrate, the method comprising the following steps in sequence:
   a) a step for supplying a temporary substrate comprising two main faces, called the first face and the second face respectively, the temporary substrate being stretchable, a plurality of structures each including a front face and a back face, being assembled by their front face on the first face;
   b) a step for stretching the temporary substrate along at least one direction so as to increase a space between structures along at least one direction; and
   c) a step for transferring the plurality of structures on a host face of a host substrate,
   wherein the temporary substrate includes a matrix made of a stretchable material, and a plurality of inserts on which the structures are assembled, the inserts comprising a material with a Young's Modulus higher than that of the stretchable material, and
   wherein the plurality of inserts are three dimensional elements contained within the temporary substrate and configured to emerge on at least one of the first face and second face.

2. Method according to claim 1, wherein step a) is preceded by a step a1) for taking off structures located on their back face, on a face of an initial substrate called the initial face.

3. Method according to claim 2, wherein the arrangement of inserts of the temporary substrate corresponds to the arrangement of structures on the initial face during the taking off step a1).

4. Method according to claim 2, wherein the take-off step a1) comprises in sequence:
an assembly of the front face of structures with inserts,
a detachment, called the first detachment, of structures from the initial substrate.

5. Method according to claim 4, wherein the first detachment requires energy, called the first detachment energy, adjusted to be less than the adhesion energy between the front face of structures and inserts.

6. Method according to claim 5, wherein the first detachment energy is less than 0.3 $J/m^2$.

7. Method according to claim 5, wherein the adjustment of the first detachment energy comprises a step to weaken the interface between the initial face and the back face.

8. Method according to claim 1, wherein step b) includes a first stretching along a first direction and a second stretching along a second direction, different from the first direction, that will increase the spacing between structures along the first and second directions.

9. Method according to claim 1, wherein step c) comprises in sequence:
an assembly of structures with the host substrate by bringing said structures into contact through their back face with the host face of the host substrate,
a detachment, called the second detachment, of structures from inserts so as to transfer said structures on the host face.

10. Method according to claim 9, wherein the second detachment of structures from inserts is preceded by a step to reinforce the assembly of structures with the host substrate.

11. Method according to claim 9, wherein the adhesion energy of structures on inserts is less than the adhesion energy of structures on the host face.

12. Method according to claim 1, wherein the stretchable material comprises an elastomer.

13. Method according to claim 12, wherein the elastomer comprises at least one material chosen from among butyl rubber, natural rubber, styrene butadiene rubber, silicone elastomers, ethylene vinyl acetate, isoprene, polchloroprene, polychloroprene, polyurethane.

14. Method according to claim 1, wherein the inserts emerae at at least the first face of the two main faces of the temporary substrate.

15. Method according to claim 1, wherein inserts comprise a material transparent in the UV wavelengths range.

16. Method according to claim 1, wherein the inserts comprise a semiconducting material.

17. Method according to claim 1, wherein the host substrate comprises sites called host sites on its host face, on which structures are transferred, the host sites being adapted to be conducive to adhesion of structures on said host sites rather than adhesion of said structures on the first face.

18. Method according to claim 17, wherein the host sites can comprise at least some elements chosen from among solder balls, micro tubes, metallic stacks providing adhesion of structures on the host face by eutectic or thermocompression bonding, magnetic materials, a polymer glue.

19. Method for transferring structures of a first type, a second type and a third type on a host substrate, the method comprising in sequence the transfer according to claim 1 of structures of the first type, the second type and the third type onto the host substrate.

20. Method according to claim 19, wherein the structures of the first type, the second type and the third type are LEDs each emitting in a different wavelength range.

* * * * *